(12) United States Patent
Fedynyshyn et al.

(10) Patent No.: US 6,794,109 B2
(45) Date of Patent: Sep. 21, 2004

(54) LOW ABOSORBING RESISTS FOR 157 NM LITHOGRAPHY

(75) Inventors: Theodore H. Fedynyshyn, Sudbury, MA (US); Roderick R. Kunz, Acton, MA (US); Michael Sworin, Tyngsboro, MA (US); Roger Sinta, Woburn, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 66 days.

(21) Appl. No.: 09/791,252

(22) Filed: Feb. 23, 2001

(65) Prior Publication Data

US 2002/0160297 A1 Oct. 31, 2002

(51) Int. Cl.$^7$ ................................................. G03F 7/004
(52) U.S. Cl. ..................... 430/270.1; 430/907; 430/914
(58) Field of Search ............................... 430/270.1, 914, 430/907, 905

(56) References Cited

U.S. PATENT DOCUMENTS

| | | | |
|---|---|---|---|
| 5,556,734 A | * | 9/1996 | Yamachika et al. ...... 430/270.1 |
| 6,042,997 A | | 3/2000 | Barclay et al. ............. 430/315 |
| 6,124,074 A | | 9/2000 | Varanasi et al. .......... 430/270.1 |
| 6,251,560 B1 | | 6/2001 | Wallow et al. ........... 430/270.1 |
| 6,306,554 B1 | | 10/2001 | Barclay et al. .......... 430/270.1 |

FOREIGN PATENT DOCUMENTS

| | | |
|---|---|---|
| DE | 42 07 261 | 9/1993 |
| JP | 49049703 A | 5/1974 |
| WO | WO 00/17712 | 3/2000 |
| WO | WO 00/67072 | 11/2000 |

OTHER PUBLICATIONS

Kishimura, Shinji et al. "Approach for VUV Positive Resists using Photodecomposable Polymers," *Advances in Resist Technology and Processing XVII* Francis M. Houlihan, Ed. Proceedings of SPIE vol. 3999 (2000) pp. 347–356.

Patterson, Kyle et al. "Polymers for 157 nm Photoresist Application: A Progress Report," *Advances in Resist Technology and Processing XVII* Francis M. Houlihan, Ed. Proceedings of SPIE vol. 3999 (2000) pp. 365–374.

Schmaljohann, Dirk et al. "Design Strategies for 157 nm Single–Layer Photoresists: Lithographic Evaluation of a Poly (α–trifluoromethyl vinyl alcohol) Copolymer," *Advances in Resist Technology and Processing XVII* Francis M. Houlihan, Ed. Proceedings of SPIE vol. 3999 (2000) pp. 330–334.

* cited by examiner

*Primary Examiner*—Rosemary Ashton
(74) *Attorney, Agent, or Firm*—Thomas J. Engellenner; Reza Mollaaghababa; Nutter McClennen & Fish LLP

(57) ABSTRACT

The present invention provides photoresist materials for use in photolithography at wavelengths less than about 248 nm. More particularly, the photoresists of the invention are particularly suited for use in 157 nm lithography. A photoresist composition of the invention includes a polymer having at least one monomeric unit having an aromatic moiety. The monomeric unit further includes at least a group, such as an electron withdrawing group, attached to the aromatic moiety. The attached group includes at least one CF bond. The polymer further includes an acidic hydroxyl group. A photoresist composition of the invention can have an absorbance in a range of 1–5 $\mu m^{-1}$ at 157 nm, rendering it particularly suitable for use as a single layer resist in 157 nm lithography.

36 Claims, No Drawings

LOW ABOSORBING RESISTS FOR 157 NM LITHOGRAPHY

The U.S. government has rights in this invention pursuant to a contract awarded by the Department of Defense, Contract No. F19628-00-0002.

BACKGROUND

The present application relates generally to photoresist materials, and more particularly, to photoresist compositions that can be utilized for lithography at 157 nm.

Photolithography employs photoresists, i.e., radiation sensitive resist materials, for transfer of images onto semiconductor wafers to selectively pattern the wafers for device manufacturing. For example, spin-on organic polymeric photoresists have enabled manufacturing of integrated circuits.

Recent advances in microlithographical techniques lay the foundation for performing lithography at sub-100 nm wavelengths. A wide variety of energy sources, such as X-rays, extreme ultra violet (EUV), low and high keV electrons, ion beams, and extended optical wavelengths, e.g., 157 nm, can potentially be employed for advanced sub-100 nm imaging. For example, lithography with 157 nm $F_2$ lasers represents the next evolutionary step in optical micro-lithography and has recently emerged as a promising candidate for the 100 run and 70 nm lithographical applications.

The resist materials developed for longer wavelengths, however, are too absorbent to be useful as single layer resists at such low wavelengths, e.g., at 157 nm. For example, polyhydroxystyrene based resists, developed for 248 nm lithography, and polyacrylate and polycyclic copolymer based resists, developed for 193-nm lithography, are too absorbent to provide a single layer resist having a thickness of 150 nm or more for use at 157 nm. A photoresist based on such polymers may be useful for 157 nm lithography only if the thickness of the resist is less than about 100 nm. This constraint on thickness can seriously compromise the resist's ability to perform its intended purpose. For example, such a resist may be too thin to withstand subsequent processing steps such as plasma etching and ion implantation.

Thus, a need exists for providing photoresists for use in microlithography, and in particular, for use at 157 nm wavelength. More particularly, a need exists for providing single layer photoresists for use at 157 nm.

SUMMARY OF THE INVENTION

The present invention provides photoresists for use in lithography at wavelengths less than about 248 nm, and more particularly, at wavelengths about 157 nm. In one aspect, a photoresist composition of the invention includes a polymer having at least one monomeric unit with an aromatic moiety. The monomeric unit further includes at least a group attached to the aromatic moiety. The attached group has at least one CF bond. The polymer further includes an acidic hydroxyl group. A photoresist of the invention has relatively low absorbance at wavelengths less than about 248 nm, e.g., absorbance in a range of 1–5 $\mu m^{-1}$, and more preferably in a range of 2–4 $\mu m^{-1}$ at 157 nm, which allows production of single layer resists at these wavelengths with sufficient thickness to be suitable for photolithography.

In one aspect, a photoresist of the invention includes a homopolymer having a chemical formula:

where
A = 2-hexafluoroisopropanol styrene, 3-hexafluoroisopropanol styrene, or 4-hexafluoroisopropanol styrene. The polymer can have a molecular weight in a range of about 5000 to 100,000 Daltons, and more preferably in a range of 5000 to 30,000 Daltons.

In another aspect, a photoresist of the invention includes a copolymer having a chemical formula:

where A and A' are two different hexafluoroisopropanol styrene moieties. For example, A can be 2-hexafluoroisopropanol styrene and A' can be 3-hexafluoroisopropanol styrene. The polymer can have a molecular weight in a range of about 5000 to 100,000 Daltons, and more preferably in a range of 5000 to 30,000 Daltons.

In related aspect, a photoresist of the invention can include a copolymer having a chemical formula:

where
A = 2-hexafluoroisopropanol styrene, 3-hexafluoroisopropanol styrene, or 4-hexafluoroisopropanol styrene, and
B = 2,3, or 4-t-butoxycarbonyl-hexafluoroisopropanol styrene, 2,3, or 4-t-butyl acetate-hexafluoroisopropanol styrene, 2,3, or 4-methoxymethoxy-hexafluoroisopropanol styrene, t-butyl acrylate, t-butyl methacrylate, or t-butyl trifluoromethacrylate.

The molar concentration of the monomeric unit A is in a range of about 40–100%, and more preferably in a range of about 50–80%, and the molar concentration of the monomeric unit B is in a range of about 0–60%, and more preferably in a range of 20–50%. Further, the polymer can have a molecular weight in a range of about 5000 to 100,000 Daltons, and more preferably in a range of 5000 to 30,000 Daltons.

In another aspect, a photoresist of the invention can include a copolymer having a chemical formula:

where
A = 2-hexafluoroisopropanol styrene, 3-hexafluoroisopropanol styrene, or 4-hexafluoroisopropanol styrene, and
C = styrene, 4-t-butylstyrene, 2,3, or 4-fluorostyrene, 2,3,4,5, 6-pentafluorostyrene, 2,3, or 4-trifluoromethylstyrene, 3,5-bis(trifluoromethyl)styrene, 2,3, or 4-hexafluoroisopropylstyrene, 2,3, or 4-trifluoroacetylstyrene, 2,3, or 4-heptafluorobutyrylstyrene, acrylonitrile, or methacrylonitrile.

The molar concentration of the monomeric unit A is in a range of about 40–100%, and more preferably in a range of about 50–80%, and the molar concentration of the monomeric unit C is in a range of about 0–60%, and more preferably in a range of 20–50%. Further, the polymer can have a molecular weight in a range of about 5000 to 100,000 Daltons, and more preferably in a range of 5000 to 30,000 Daltons In another aspect, a photoresist of the invention can include a terpolymer having a chemical formula:

where A is selected to be 2-hexafluoroisopropanol styrene, and A' is selected to be 3-hexafluoroisopropanol styrene, and A" is selected to be 4-hexafluoroisopropanol styrene. The polymer can have a molecular weight in a range of about 5000 to 100,000 Daltons, and more preferably in a range of 5000 to 30,000 Daltons Another photoresist according to the invention can include a terpolymer having a chemical formula:

[-A-B-C-]$_n$ where
A = 2-hexafluoroisopropanol styrene, 3-hexafluoroisopropanol styrene, or 4-hexafluoroisopropanol styrene, and
B=2,3, or 4-t-butoxycarbonyl-hexafluoroisopropanol styrene, 2,3, or 4-t-butyl acetate-hexafluoroisopropanol styrene, 2,3, or 4-methoxymethoxy-hexafluoroisopropanol styrene, t-butyl acrylate, t-butyl methacrylate, t-butyl trifluoromethacrylate, and
C=styrene, 4-t-butylstyrene, 2,3, or 4-fluorostyrene, 2,3,4,5, 6-pentafluorostyrene, 2,3, or 4-trifluoromethylstyrene, 3,5-bis(trifluoromethyl)styrene, 2,3, or 4-hexafluoroisopropylstyrene, 2,3, or 4-trifluoroacetylstyrene, 2,3, or 4-heptafluorobutyrylstyrene, acrylonitrile, or methacrylonitrile.

The molar concentration of A is selected to be in a range of about 40–100%, and more preferably in a range of 50–80%, and the molar concentration of B is selected to be in a range of 0–60%, and more preferably in a range of 20–50%. Further, the molar concentration of C is selected to be in a range of about 0–50%, and more preferably in a range of about 0–30%. The polymer has a molecular weight in a range of about 5000–100,000 Daltons, and more preferably in a range of 5000 to 30,000 Daltons.

In addition to the polymers described above, a photoresist composition of the invention can also contain a small amount of base which may help to stabilize the polymer system. In general, less than 1% of the polymer composition is a base component, based on the total weight of the polymer composition, e.g., less than 0.5%. Suitable bases typically are organic bases known in the art such as tetrabutylammonium hyroxide, diazabicyclo[5.4.0]undec-7-ene, diphenyl amine, trioctyl amine, or triheptyl amine.

Further, a photoresist composition of the invention can include a photoacid generator. The term "photo-acid generator" is recognized in the art and is intended to include those compounds which generate acid in response to radiant energy. Preferred photoacid generators for use in the present invention are those that are reactive to deep UV radiation, e.g., to radiant energy having a wavelength equal to or less than 248 nm, and are preferably highly reactive to radiation at 157 nm. The combination of the photo-acid generator and polymer should be soluble in an organic solvent. Preferably, the solution of the photo-acid generator and polymer in the organic solvent are suitable for spin coating. The photo-acid generator can include a plurality of photo-acid generators. The photo-acid generator is included in the composition at levels between about 0.01% and about 50%, more preferably between about 0.5% and about 20%, and most preferably between about 1.0% and about 10%, based on the total weight of the polymer composition.

Suitable photo-acid generators include onium salts, such as triphenylsulfonium salts, sulfonium salts, iodonium salts, diazonium salts and ammonium salts, 2,6-nitrobenzylesters, aromatic sulfonates, sulfosuccinimides and photosensitive organic halogen compounds as disclosed in Japanese Examined Patent Publication No. 23574/1979.

Examples of diphenyliodonium salts include diphenyliodonium triflate (DPI-105, Midori Kagaku Co. Ltd.) and diphenyliodonium tosylate (DPI-201, Midori Kagaku Co. Ltd.). Examples of suitable bis(4-tert-butylphenyl)iodonium salts include bis(4-tert-butylphenyl)iodonium triflate (BBI-105, Midori Kagaku Co. Ltd.), bis(4-tert-butylphenyl) iodonium camphorsulfate (BBI-106, Midori Kagaku Co. Ltd.), bis(4-tert-butylphenyl)iodonium perfluorbutylate (BBI-109, Midori Kagaku Co. Ltd.) and bis(4-tert-butylphenyl)iodonium tosylate (BBI-201, Midori Kagaku Co. Ltd.). Suitable examples of triphenylsulfonium salts include triphenylsulfonium hexafluorophosphate (TPS-102, Midori Kagaku Co. Ltd.), triphenylsulfonium triflate (TPS-105, Midori Kagaku Co. Ltd.) and triphenylsulfonium perfluorobutylate (TPS-109, Midori Kagaku Co. Ltd.). An example of an aromatic sulfonate is 1,2,3-tri(methanesulfonyloxy)benzene.

Specific examples of the photosensitive organic halogen compound include halogen-substituted paraffinic hydrocarbons such as carbon tetrabromide, iodoform, 1,2,3,4-tetrabromobutane and 1,1,2,2-tetrabromoethane; halogen-substituted cycloparaffinic hydrocarbons such as hexabromocyclohexane, hexachlorocyclohexane and hexabromocyclododecane; halogen-containing s-triazines such as tris(trichloromethyl)-s-triazine, tris(tribromomethyl)-s-triazine, tris(dibromomethyl)-s-triazine and 2,4-bis(tribromomethyl)-6-methoxyphenyl-s-triazine; halogen-containing benzenes such as (bis(trichloromethyl) benzene and bis(tribromomethyl)benzene; halogen-containing sulfone compounds such as tribromomethylphenylsulfone, trichloromethylphenylsulfone and 2,3-dibromosulforane; and halogen-substituted isocyanurates such as tris(2,3-dibromopropyl)isocyanurate. Among such photosensitive organic halogen compounds, a bromine-containing compound is particularly preferred.

In another aspect, a polymer of a photoresist composition of the invention includes carbon atoms bearing protected hydroxyl groups, and the protecting groups are labile in the presence of in situ generated acid. The term "protected hydroxyl group" is well recognized in the art and is intended to include those groups which are resistant to basic solutions but are removed under acidic conditions. The hydroxyl groups of the polymer can be protected by chemical reactions by using protecting groups which render the reactive hydroxyl groups substantially inert to the reaction conditions. (See for example, Protective Groups in Organic Synthesis, 2 ed., T. W. Green and P. G. Wuts, John Wiley & Sons, New York, N.Y. 1991). Thus, for example, protecting groups such as the following may be utilized to protect hydroxyl groups: acetals, ketals, esters, e.g., t-butyl esters, and ethers known in the art; trialkyl silyl groups, such as trimethylsilyl and t-butyldimethylsilyl (TBDMS); and groups such as trityl, tetrahydropyranyl, vinyloxycarbonyl, o-nitrophenylsulfonyl, diphenylphosphinyl, p-toluenesulfonyl, and benzyl, may all be utilized. Additionally, $CH_3OCH_2Cl$, $(CH_3)_3SiCH_2CH_2OCH_2Cl$, $CH_3OCH_2CH_2OCH_2Cl$, $ClCO_2$-t-butyl, methyl dihydropyran, methyl dihydrofuran, tetrabutylvinylether, 2-methoxypropene, isobutylvinylether and ethylvinylether are useful as protecting groups. (See for example, C. Mertesdor et al. Microelectronics Technology, 1995, pg. 35–55.)

The protecting group may be removed, after completion of the synthetic reaction of interest, by procedures known to those skilled in the art. For example, acetal and ketal groups may be removed by acidolysis, the trityl group by hydrogenolysis, TBDMS by treatment with fluoride ions, and TCEC by treatment with zinc. One skilled in the art will appreciate that the choice of a hydroxyl protecting group(s) is tailored to the specific application and conditions to which the protected hydroxyl group must withstand. Ultimately, the generation of acid from the photo-acid will cleave the oxygen bond to the protecting group to regenerate a free hydroxyl group.

An interaction between an energy source, e.g. a source that generates 157 nm radiation, and the photo-acid generator results in the release of acid which facilitates selective cleavage of protecting groups from hydroxyl sites. As a consequence, the resultant unprotected hydroxyl groups are susceptible to solubilization under basic conditions, i.e., the regions of the photoresist material that are exposed to the far UV radiation are rendered alkali soluble, whereas the unexposed (protected hydroxyl) regions of the photoresist material remain alkali insoluble. Suitable protecting groups for the hydroxyl groups of the polymer include acetals, ketals, esters (including carbonates) and ethers.

In addition to the hydroxyl protected polymer and photoacid generator, small molecules which help to inhibit hydrolysis of the protected hydroxyl groups can be included in the compositions of the invention. These small molecules are typically ester, ether, ketal or acetal protected low molecular weight polyhydridic alcohols or low molecular weight alcohols. The protecting groups can further include those listed below. Suitable low molecular weight hydrolysis inhibitors include, for example, Di-Boc Bisphenol A, Di-Boc o-cresolphthalein, tert-butyl lithocholate and tert-butyl deoxycholate (available from Midori Kagaku Co., Ltd. Tokyo, Japan).

Thus the above described compositions include protected hydroxyl groups which are labile in the presence of in situ generated acid. Upon exposure to a far UV energy source, e.g. a source which generates 157 nm radiation, the photo-acid generator will release acid to facilitate selective cleavage of protecting groups from protected hydroxyl sites. As a consequence, the resultant unprotected hydroxyl groups will be susceptible to solubilization under basic conditions and the exposed photoresist material is rendered alkali soluble, whereas the unexposed photoresist material will remain alkali insoluble.

In another aspect, the invention provides a single layer 157 nm sensitive photoresist, which includes a photoresist composition having a polymer with at least one monomeric unit with an aromatic moiety. The monomeric unit can further include a group, such as an electron withdrawing group, having at least one CF bond attached to the aromatic moiety.

A single layer 157 nm sensitive photoresist according to the invention can have an absorbance at 157 nm in a range of about 1–5 $\mu m^{-1}$. More preferably, the photoresist has an absorbance in a range of approximately 2–4 $\mu m^{-1}$. Such an absorbance allows production of single layer resists having a thickness in range of approximately 50 to 300 nm 1 and more preferably in a range of 100 nm to 150 nm, for use in 157 nm lithography.

According to a related aspect, a single layer resist of the invention for use in 157 nm lithography can include a copolymer or a terpolymer having a monomeric unit that can be selected to be, for example, 4-trifluoromethyl styrene, 3,5-bis(trifluoromethyl) styrene, 4-hexafluoroisopropyl styrene, 4-trifluoroacetyl styrene, 4-heptafluorobutyrylstyrene, 2-hexafluoroisopropanol styrene, 3-hexafluoroisopropanol styrene, 4-hexafluoroisopropanol styrene, 4-t-butoxycarbonyl-hexafluoroisopropanol styrene, 4-t-butyl acetate-hexafluoroisopropanol styrene, and 4-methoxymethoxy-hexafluoroisopropyl styrene.

These and other aspects of the invention can be better understood by reference to the following detailed description and the appended claims.

DETAILED DESCRIPTION

The present invention provides photoresists and methods for producing photoresists for use in microlithography, and more particularly, for use at 157 nm wavelength. The photoresists of the invention have structures based on homopolymers, copolymers or terpolymers having at least one monomeric with an aromatic moiety. The aromatic moiety is attached to a group having at least one CF bond. The polymer further includes an acidic hydroxyl group. Applicants have discovered that the presence of at least one CF bond in the group attached to the aromatic moiety lowers the absorption coefficient at 157 nm of a photoresist having such copolymers or terpolymers, thus rendering the photoresist particularly useful for lithography at this wavelength. For example, the low absorbance allows producing resists with a thickness in a range of about 100 nm to about 200 nm.

In one embodiment, a photoresist composition of the invention includes homopolymer, a copolymer or a terpolymer in which at least one of the monomeric units is selected to be 2-hexafluoroisopropanol styrene, 3-hexafluoroisopropanol styrene, or 4-hexafluoroisopropanolstyrene, having formulas (1), (2), and (3), respectively:

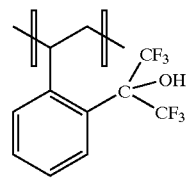

1

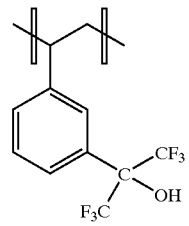

2

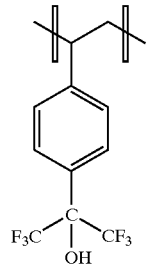

3

In one embodiment, the photoresist of the invention can be a copolymer having two monomeric units, each of which is a hexafluoroisopropanol moiety. For example, the copolymer can have 4-hexafluoroisopropanolstyrene as one monomeric unit and 3-hexafluoroisopropanol styrene as the other monomeric unit.

Alternatively, the photoresist of the invention can include a copolymer or a terpolymer having 2-hexafluoroisopropanol styrene, 3-hexafluoroisopropanol styrene, or 4-hexafluoroisopropanolstyrene as one monomeric unit and having 4-trifluoromethyl styrene, 3,5-bis (trifluoromethyl) styrene, or 4-hexafluorisopropyl styrene, with chemical formulas (4), (5), and (6), respectively, as another monomeric unit.

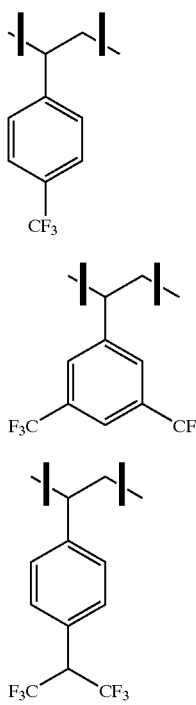

In another embodiment, the photoresist of the invention includes a polymer having a hexafluoroisopropanol moiety as one monomeric unit and having another monomeric unit that is selected to be 4-trifluoroacetyl styrene, or 4-heptafluorobutyrylstyrene having the following chemical formulas (7), and (8), respectively:

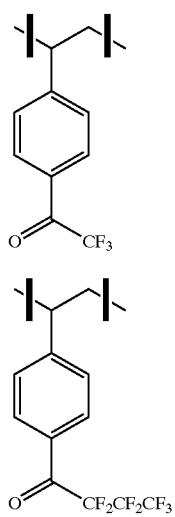

In yet another embodiment, a polymer of a photoresist of the invention includes a hexafluoroisopropanol moiety as one monomeric unit, and further includes another monomeric unit that is selected to be 4-t-butoxycarbonyl-hexafluoroisopropanol styrene, 4-t-butyl acetate-hexafluoroisopropanol styrene, or 4-methoxymethoxy-hexafluoroisopropyl styrene having chemical formulas (9), (10), and (11), respectively:

The photoresist compositions of the invention have absorption coefficients at 157 nm which lie in a range of approximately 1.0 to 5.0 $\mu m^{-1}$. Such relatively low absorption coefficients allow producing a single layer photoresist having a thickness in a range of about 100 to 150 nm for use in 157 nm lithography.

In some embodiments of the invention, a photoresist composition according to the teachings of the invention includes a copolymer having hexafluoroisopropanol styrene as one monomeric unit, and having another monomeric unit in which the hexafluoroisopropanol styrene is inhibited by t-butoxycarbonyloxy (e.g., structure 9). For example, such a copolymer can include 4-hexafluoroisopropanol as one monomeric unit, and 4-t-butoxycarbonyl-hexafluoroisopropanol styrene as another monomeric unit. Such a copolymer is capable of acid catalyzed dissolution changes in a manner similar to the 248 nm polyhydroxy-styrene analog.

Another photoresist according to the teachings of the invention includes a copolymer in which hexafluoroisopropanolstyrene is copolymerized with t-butylacrylate or t-butylmethacrylate, or t-butyl trifluoromethacrylate having the following chemical formulas (12), (13), and (14), respectively:

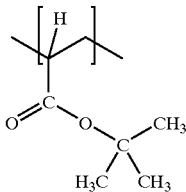

12

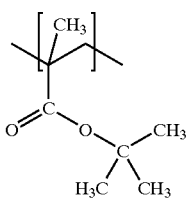

13

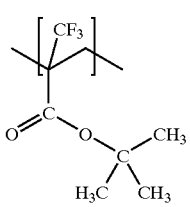

14

Such copolymers are also capable of acid catalyzed dissolution changes in which the t-butyl ester is cleaved to yield a carboxylic acid. These copolymers are akin to the 248-nm resists which are based on hydroxystyrene and t-butylacrylic copolymers.

In another embodiment, the photoresist of the invention includes a copolymer in which some of the hexafluoroisopropanolstyrene is inhibited by a ketal or acetal. Such a copolymer is also capable of acid catalyzed dissolution changes in much the same way as the polyhydroxystyrene analog (e.g., structure 11). Another example of a copolymer utilized in a photoresist composition of the invention includes hexafluoroisopropanolsytrene as one monomeric unit, and further includes another monomeric unit in which the hexafluoroisopropanolstyrene is inhibited by the formation of a t-butyl ether acetate (e.g., structure 10). This copolymer can also undergo acid catalyzed dissolution changes in which the t-butyl ester is cleaved to yield a caboxylic acid.

Further, a photoresist of the invention can include a copolymer in which one of the monomeric units has an acidic hydroxyl group and includes an aromatic moiety having a group with a CF bond attached thereto, and the other monomeric unit is selected to be 3-fluorostyrene, or 4-fluorostyrene, or 2,3,4,5,6-pentafluorostyrene having chemical formulas (15), (16), and (17), respectively:

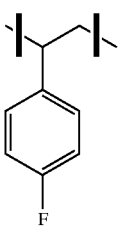

15

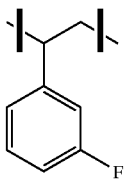

16

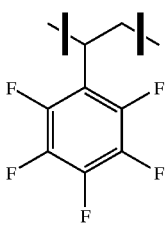

17

As shown below in the experimental section, homopolymers of 3-fluorostyrene, 4-fluorostyrene, and pentafluorostyrene exhibit relatively high absorption coefficients at 157 nm, e.g., in a range of about 5.8–7.08 $\mu m^{-1}$. Hence, these homopolymers are not particularly suitable for use in 157 nm lithography. In other words, simply substituting one or more fluorine atoms for hydrogen atoms of an aromatic moiety of a monomeric unit does not necessarily provide a photoresist composition with low enough absorption coefficient at 157 nm to be useful for lithography at this wavelength.

As discussed above, a photoresist composition of the invention can include a terpolymer in which at least one of the monomeric units includes an aromatic moiety with at least one CF bond attached thereto, either directly or indirectly, and further includes an acidic hydroxyl group. For example, a photoresist of the invention can include a terpolymer having hexafluoropropanolstyrene as one monomeric unit, and a second monomeric unit that can undergo acid catalyzed dissolution changes. The third monomeric unit can be selected to lower the absorption coefficient of the polymer and consequently the formulated resist at the wavelength of interest, e.g., at 157 nm. Examples of a second monomeric unit that can be utilized in a terpolymer of a photoresist of the invention are 2,3, or 4-t-butoxycarbonyl-hexafluoroisopropanol styrene, 2,3, or 4-t-butyl acetate-hexafluoroisopropanol styrene, 2,3, or 4-methoxymethoxy-hexafluoroisopropanol styrene, t-butyl acrylate, t-butyl methacrylate, t-butyl trifluoromethacrylate. Examples of a third monomeric unit are styrene, 4-t-butylstyrene, 2,3, or 4-fluorostyrene, 2,3,4,5,6-pentafluorostyrene, 2,3, or 4-trifluoromethylstyrene, 3,5-bis(trifluoromethyl)styrene, 2,3, or 4-hexafluoroisopropylstyrene, 2,3, or 4-trifluoroacetylstyrene, 2,3, or 4-heptafluorobutyrylstyrene, acrylonitrile, or methacrylonitrile The photosensitive composition of the present invention can be used by dissolving the composition in a solvent. The solvent is not particularly limited, so long as it is a solvent capable of presenting adequate solubility to the resin, photo-acid-generating material and capable of providing good coating properties. For example, it may be a cellosolve type solvent such as methyl cellosolve, ethyl cellosolve, methyl cellosolve acetate or ethyl cellosolve acetate. Ethylene glycol based solvents such as ethylene glycol monomethyl ether, diethylene glycol monomethyl ether, diethylene glycol dibutyl ether, diethylene glycol and diethylene glycol dimethyl ether are suitable as organic solvents for the photosensitive compositions of the invention. Propylene glycol based solvents such as propylene glycol monoethyl ether, propylene glycol monobutyl ether, propylene glycol monomethyl ether acetate, dipropylene glycol dimethyl ether or propylene glycol monoethyl ether acetate can be used. Suitable ester type solvents include butyl acetate, amyl acetate, ethyl butyrate, butyl butyrate, diethyl oxalate, ethyl pyruvate, ethyl-2-hydroxybutyrate, 2-methyl-acetoacetate, methyl lactate or ethyl lactate. Alternatively, alcohols are utilized and include heptanol, hexanol, nonanol, diacetone alcohol or furfuryl alcohol. Examples of suitable ketone solvents include cyclohexanone or methylamyl ketone. Ethers useful as solvating agents include methyl phenyl ether or diethylene glycol dimethyl ether. Polar solvents, such as dimethylformamide or N-methylpyrrolidone can also be used. The solvents can be used alone or as combinations of two or more solvents.

Typically the solvent is used in an amount of from 1 to 100 times by weight, e.g., 20 to 30 times by weight, relative to the total amount of the solid content of the photosensitive composition.

Further, the photosensitive composition of the present invention may contain various additives such as a surfactant, a coating property-improving agent, a stabilizer, a colorant and an ultraviolet absorber, to such an extent not to impair the desired properties.

Suitable surfactants which can be added to the photosensitive composition to improve coating ability include nonionic surfactants including polyoxyethylene alkyl ethers such as polyoxyethylene lauryl ether, polyoxyethylene stearyl ether and polyoxyethylene oleyl ether, polyoxyethylene alkylphenyl ethers such as polyoxyethylene octylphenyl ether and polyoxyethylene nonylphenyl ethers. Suitable nonionic ester surfactants include polyethylene glycol dialkyl esters such as polyethylene glycol dilaurate and polyethylene glycol distearate. Alternatively, fluorine-containing surfactants can be utilized which contain a fluoroalkyl or perfluoroalkyl group such as Efftop EF301, EF303 and EF352 (manufactured by Shinakitakasei Co., Ltd.), Megafac F171, F172 and F173 (manufactured by Dainippon Ink Co., Ltd.), Asahiguard AG710 (manufactured by Asahi Glass Co., Ltd.), Fluorad FC430 and FC431 (manufactured by Sumitomo 3M Co., Ltd.), and Surflone S-382, SC101, SC102, SC103, SC104, SC105 and SC 106 (manufactured by Asahi Glass Co., Ltd.). Organosiloxane surfactants, such as organosiloxane polymer KP341 (manufactured by Shinetsu Kagaku Kogyo Co., Ltd.) are also suitable for decreasing the surface tension of the solution containing the photosensitive composition. Additionally, acrylic acid- or methacrylic acid-type polymers and copolymers such as Polyflow No. 75, No. 95 and WS (manufactured by Kyoeisha Yushikagaku Kogyo Co., Ltd.); and the like are also suitable surfactants. The amount of the surfactant to be added is usually less than 2 parts by weight, preferably 0.005–1 part by weight, per 100 parts by weight of the abovementioned condensate.

Furthermore, antioxidants or defoaming agents can be compounded as required to the radiation-sensitive composition of this invention.

After coating, the solvent will usually be removed by drying, conveniently in the temperature range from 70° to 160° C.

The resist film is a photopolymer composition which, after drying, has high photosensitivity, is not subject to autocatalytic decomposition, and has very good adhesion to the substrate. Furthermore, the resist film has high transparency and sensitivity, even in the wavelength range of 157 nm, and has good thermal stability.

To produce relief structures the substrate coated with the formulation of the present invention and is then exposed. The expression "exposure" will be understood as meaning not only exposure through a photomask that contains a predetermined pattern, for example a photographic transparency, but also exposure with a laser beam that is moved by computer control over the surface of the coated substrate to produce an image, irradiation with computer-controlled electron beams, as well as exposure with X-ray or UV radiation through an appropriate mask.

Exposure is normally carried out with UV radiation, preferably in the wavelength range from about 130 to 400 nm, more particularly from 150 to 200 nm and, most preferably, at 157 nm. Various known sources of radiation can be used for exposure, typically including mercury high-pressure lamps and UV lasers and, preferably, excimer lasers. The process parameters such as exposure time and distance from the radiation source and radiation-sensitive layer will usually depend on the type of radiation-sensitive formulation and on the desired properties of the coating, and can be determined by the person skilled in the art by routine experimentation.

After exposure, the wafer can be heated or baked at about 50° to about 160° C. for a few seconds to a few minutes. Subsequently the exposed areas of the photoresist are washed out with a developer. The choice of developer will depend on the type of photoresist, in particular on the nature of the binder employed or of the resultant photolysis products. The developer may comprise aqueous solutions of bases to which organic solvents or mixtures thereof may be added.

The novel formulations are preferably used as positive photoresists. A further object of the invention is therefore a process for the production of relief structures, which process comprises the following process steps in the indicated sequence:

Applying a layer consisting of a formulation as described above to a substrate;

Exposing of the coating with radiation; and

Treating the coating with a developer consisting of an aqueous alkaline solution until the areas subjected to radiation are removed.

Particularly preferred developers are the aqueous alkaline solutions that typically include solutions of alkali metal silicates, alkali metal phosphates, alkali metal hydroxides and alkali metal carbonates, but preferably tetraalkylammonium hydroxide solutions such as tetramethylammonium hydroxide solution. To these solutions may be added minor amounts of wetting agents and/or organic solvents. Typical organic solvents that may be added to the developer fluids include cyclohexanone, 2-ethoxyethanol, toluene, acetone, isopropanol, ethanol, as well as mixtures of two or more of these solvents.

The application of the developer is preferably effected by immersing the coated and imagewise exposed substrate in the developer solution, by spraying the developer solution on to the substrate, or by repeatedly applying and spin-coating the developer on to the coated and imagewise exposed substrate.

With the photosensitive compositions of the present invention, it is possible to obtain a pattern profile of high resolution by exposure with a light having a wavelength in the deep UV region. Accordingly, the compositions are extremely useful as photoresists, particularly for the production of very large scale integrated circuits.

The photoresists of the invention provide further advantages. For example, a photoresist of the invention can be utilized as a single layer sensitive resist having a thickness of about 100 nm to 150 nm for performing high resolution lithography. Traditional photoresist compositions are too absorbing at 157 nm to be useful as single layer resists with sufficient thickness. In particular, a high absorption at 157 nm limits the depth of light penetration into the resist, and hence prevents complete exposure of the bottom of the resist to radiation. Without complete exposure, the resist can not image. It is possible to form extremely thin resists in which the light can penetrate to the bottom of the resist. Such resists, however, can not withstand subsequent processing steps such as plasma etching and/or ion implantation.

In contrast, the photoresists of the invention can be formed as single layers having sufficient thickness to be suitable for lithography.

Some of the monomeric units described above that can be utilized in a copolymer or terpolymer of a photoresist of the invention, are novel materials. For example, 4-hexafluorisopropyl styrene, 4-heptafluorobutyrylstyrene, and 4-t-butyl acetate-hexafluoroisopropanol styrene whose chemical formulas are depicted above, present novel compositions of matter.

The following experimental section provides a number of examples of photoresist compositions of the invention and method of their production to further elucidate the invention. It should be understood that the following examples are presented only for illustrative purposes, and are not intended to limit the scope of the invention.

EXAMPLE 1

Preparation of (4-Vinylphenyl)magnesium Bromide

The Grignard reagent was prepared by a modification of the procedure of Sekiya and Stille, described in an article published in Journal of American Chemical Society, 1981, 103, 5096, herein incorporated by reference. A crystal of iodine was added to a mixture of Mg turnings (7.30 g, 300.29 mmol) in anhydrous THF (200 mL), followed by the dropwise addition of a solution of p-bromostyrene (48.81 g, 266.65 mmol) in THF (50 mL), over 1 h. The reaction mixture became warm after about one quarter of the solution was added, and a water bath was used to keep the internal temperature between 25 to 30° C. The reaction mixture was then stirred at room temperature for an additional 1 h.

EXAMPLE 2

Preparation of 1,1,1,3,3,3-Hexafluoro-2-(4-vinylphenyl)-2-propanol

The title compound was prepared by a modification of the procedure of Przybilla, described in German Patent No. DE4207261A1 (Sep. 9, 1993), herein incorporated by reference. The (4-vinylphenyl)magnesium bromide solution of Example 1 was cooled to −40 to −30° C. using a dry ice/acetone bath. Subsequently, hexafluoroacetone was introduced below the surface until an excess was achieved (weight added 62 g, 373.45 mmol). The reaction mixture was stirred in the cooling bath for 15 min, then placed in an ice-bath for an additional 15 min, and finally poured into cold 1N $H_2SO_4$ (1000 mL). The aqueous solution was extracted with ether, and the combined extracts were washed with brine, dried ($Na_2SO_4$), and concentrated to provide 101.60 g of a pale yellow oil. This material was purified by vacuum distillation to provide 52.43 g (73%) of a colorless oil: bp 55–6° C. (1.3 mm); $^1$H NMR (CDCl$_3$) δ 7.69 (d, 2ArH), 7.50 (d, 2ArH), 6.75 (dd, CH=), 5.84 (dd, =CHH), 5.36 (dd, =CHH), 3.73 (s, OH),+9% THF.

EXAMPLE 3

Preparation of 1,1,1,3,3,3-Hexafluoro-2-(2-vinylphenyl)-2-propanol

The title compound was prepared by the general procedure used to make the 4-vinyl compound of Example 2. Vacuum distillation provided 23.36 g (62%) of a colorless oil: bp 51–2° C. (2.0 mm); $^1$H NMR (CDCl$_3$) δ 7.64 (d, ArH), 7.50–7.35 (m, 3ArH+CH=), 5.52 (dd, =CHH), 5.44 (dd, =CHH), 3.88 (s, OH),+2% THF.

EXAMPLE 4

Preparation of 1,1,1,3,3,3-Hexafluoro-2-(3-vinylphenyl)-2-propanol

The title compound was prepared by the general procedure used to make the 4-vinyl compound of Example 2. Vacuum distillation provided 25.89 g (72%) of a colorless oil: bp 52–4° C. (1.3–1.5 mm); $^1$H NMR (CDCl$_3$) δ 7.79 (br s, ArH), 7.64 (br d, ArH), 7.56 (d, ArH), 7.44 (t, ArH), 6.78 (dd, CH=), 5.84 (dd, =CHH), 5.35 (dd, =CHH), 4.22 (s, OH),+21% THF.

EXAMPLE 5

Preparation of (4-Isopropenylphenyl)magnesium Bromide

A crystal of iodine was added to a mixture of Mg turnings (3.25 g, 133.69 mmol) in anhydrous THF (60 mL), heated in an oil bath at 65° C., followed by the dropwise addition of a solution of p-chloro-α-methylstyrene (15.26 g, 100.00 mmol) and ethylene dibromide (1.00 mL, 11.60 mmol) in THF (15 mL), over 1 h. The reaction was sluggish, therefore the oil bath temperature was increased to 75° C. and the reaction mixture was kept at that temperature for 24 h.

EXAMPLE 6

Preparation of 1,1,1,3,3,3-Hexafluoro-2-(4-isopropenylphenyl)-2-propanol

The title compound was prepared from (4-isopropenylphenyl)magnesium bromide of Example 5 by the general procedure used to make the 4-vinyl compound of Example 2. Vacuum distillation provided 19.25 g (68%) of a colorless oil: bp 77–8° C. (1.8 mm); $^1$H NMR (CDCl$_3$) δ 7.71 (d, 2ArH), 7.58 (d, 2ArH), 5.47 (m, =CHH), 5.20 (apparent quintet, =CHH), 3.56 (s, OH), 2.19 (s, Me),+5% THF.

EXAMPLE 7

Preparation of 2,2,2-Trifluoro-1-(4-vinylphenyl) ethanone

The (4-vinylphenyl)magnesium bromide solution of Example 1 was cooled to −78° C. using a dry ice /acetone bath and a solution of methyl trifluoroacetate (20.00 g, 156.19 mmol) in THF (25 mL) was added dropwise over 15 min. The reaction mixture was stirred in the cooling bath for 1 h, then quenched by pouring into cold 1N $H_2SO_4$. The aqueous solution was extracted with ether and the combined extracts were washed with brine, dried ($Na_2SO_4$), and concentrated to provide 17.81 g of a pale yellow oil. This material was purified by vacuum distillation to provide 12.65 g (46%) of a colorless oil: bp 59–60° C. (1.4 mm); $^1$H NMR (CDCl$_3$) δ 8.05 (d, 2ArH), 7.55 (d, 2ArH), 6.79 (dd, CH=), 5.97 (dd, =CHH), 5.51 (dd =CHH).

EXAMPLE 8

Preparation of 1-(2,2,2-Trifluoro-1-trifluoromethylethyl)-4-vinylbenzene

The title compound was prepared by a modification of the procedure of Klabunde and Burton, described in Journal of American Chemical Society (1972, 94, 820), herein incorporated by reference. To a solution of 2,2,2-trifluoro-1-(4- vinylphenyl)ethanone (8.27 g, 41.32 mmol) in diglyme (80 mL) was added PPh$_3$ (21.67 g, 82.62 mmol) plus a few crystals of 3,5-di-tert-butylcatechol. The reaction mixture was heated in an oil bath to 150° C., then a solution of ClCF$_2$CO$_2$Na (12.60 g, 82.64 mmol) in diglyme (40 mL) was added in portions over 1 h. The reaction mixture was kept at 150° C. for 1 h, allowed to cool to 95° C., then KF (5.28 g, 90.88 mmol) in H$_2$O (1.65 mL, 91.56 mmol) was added in one portion. The reaction mixture was kept at 95° C. overnight, allowed to cool to room temperature, diluted with H$_2$O, and extracted with hexane. The combined extracts were washed with brine, dried (Na$_2$SO$_4$), and concentrated to provide 24.75 g of a reddish oil. This material was purified by filtration chromatography on silica gel using hexane to provide 5.56 g of a pale yellow oil, followed by vacuum distillation to provide 4.62 g (44%) of a colorless oil: bp 43–4° C. (1.3 mm); $^1$H NMR (CDCl$_3$) δ 7.42 (d, 2ArH), 7.34 (d, 2ArH), 6.68 (dd, CH=), 5.77 (dd, =CHH), 5.30 (dd, =CHH), 4.00 (septet, CH).

EXAMPLE 9

Preparation of 2,2,3,3,4,4,4-Heptafluoro-1-(4-vinylphenyl)-1-butanone

The title compound was prepared by the general procedure used to make the trifluoromethyl compound of Example 6. Vacuum distillation provided 14.50 g (35%) of a colorless oil: bp 62–3° C. (1.0 mm); $^1$H NMR (CDCl$_3$) δ 8.02 (d, 2ArH), 7.50 (d, 2ArH), 6.74 (dd, CH=), 5.93 (dd, =CHH), 5.47 (dd, =CHH).

EXAMPLE 10

Preparation of tert-Butyl 1,1,1,3,3,3-Hexafluoro-2-(4-vinylphenyl)-2-propyl Carbonate The title compound was prepared by a modification of the procedure of Przybilla, described in German Patent No. DE42072261A1 (Sep. 9, 1993), herein incorporated by reference. 9.35 mL of (t-BOC)$_2$O (40.70 mmol) in THF (10 mL) was added to a mixture of 1,1,1,3,3,3-Hexafluoro-2-(4-vinylphenyl)-2-propanol (10.00 g, 37.01 mmol) and K$_2$CO$_3$ (10.00 g, 72.35 mmol) in THF (90 mL) was added. The reaction mixture was allowed to stir at room temperature for 4 days, concentrated, then partitioned between hexane/H$_2$O. The aqueous solution was extracted with hexane, and the combined extracts were washed with brine, dried (Na$_2$SO$_4$), and concentrated to provide 15.17 g of a pale yellow oil. This material was purified by column chromatography on silica gel using 50:1 hexane/ethyl acetate to provide 5.16 g (38%) of a white solid, plus 4.68 g of a 90:10 mixture of protected/unprotected material; $^1$H NMR (CDCl$_3$) δ 7.49 (d, 2ArH), 7.42 (d, 2ArH), 6.74 (dd, CH=), 5.83 (dd, =CHH), 5.36 (dd, =CHH), 1.49 (s, t-Bu).

EXAMPLE 11

Preparation of tert-Butyl [2,2,2-Trifluoro-1-trifluoromethyl-1-(4-vinylphenyl)ethoxy]acetate A 1M solution of t-BuOK in THF (25.00 mL, 25.00 mmol) was slowly added to a solution of 1,1,1,3,3,3-Hexafluoro-2-(4-vinylphenyl)-2-propanol (5.48 g, 20.30 mmol) in THF (25 mL). The reaction mixture was allowed to stir at room temperature for 30 min, then cooled to −78° C. using a dry ice/acetone bath followed by the addition of t-butyl bromoacetate (3.75 mL, 25.40 mmol). The reaction mixture was allowed to slowly warm to room temperature overnight, concentrated, diluted with hexane, filtered through celite, and concentrated to provide 7.96 g of a reddish-yellow oil. This material was purified by column chromatography on silica gel using 50:1 hexane/ethyl acetate to provide 6.44 g (82%) of a colorless oil; $^1$H NMR (CDCl$_3$) δ 7.60 (d, 2ArH), 7.50 (d, 2ArH), 6.75 (dd, CH=), 5.85 (dd, =CHH), 5.40 (dd, =CHH), 4.05 (s, CH$_2$), 1.50 (s, t-Bu).

EXAMPLE 12

Preparation of 1-(2,2,2-Trifluoro-1-methoxymethoxy-1-trifluoromethylethyl)-4-vinylbenzene A solution of 1,1,1,3,3,3-hexafluoro-2-(4-vinylphenyl)-2-propanol (5.00 g, 18.51 mmol) in THF (10 mL) was slowly added to a mixture of NaH (60% dispersion, 968 mg, 24.20 mmol), washed with pentane, and THF (50 mL). The reaction mixture was allowed to stir at room temperature for 1 h, then cooled to −78° C. using a dry ice/acetone bath followed by the addition of chloromethyl methyl ether (1.50 mL, 19.75 mmol) in THF (5 mL). The reaction mixture was allowed to slowly warm to room temperature overnight, quenched with H$_2$O, concentrated, and partitioned between ether/H$_2$O. The combined extracts were washed with saturated NaHCO$_3$, brine, dried (Na$_2$SO$_4$), and concentrated to provide a crude oil. This material was purified by Kugelrohr distillation (bp 65–9° C., 1.3 mm), followed by column chromatography on silica gel using 50:1 hexane/ethyl acetate to provide 1.96 g (34%) of a colorless oil; $^1$H NMR (CDCl$_3$) δ 7.60 (d, 2ArH), 7.50 (d, 2ArH), 6.75 (dd, CH=), 5.85 (dd =CHH), 5.40 (dd =CHH), 4.85 (s, CH$_2$), 3.60 (s, Me).

Preparation of Polymers

General polymerization experimental conditions:

All polymers were synthesized by first dissolving the monomers in tetrahydrofuran (20% weight/volume), followed by bubbling nitrogen through the solution for 30 minutes. The initiator used was azoisobutyronitrile (1–3 mole percent) and after addition, the mixture was heated to reflux while maintaining a nitrogen blanket. After 18 hours, the mixture was concentrated by 50% and added to hexane to precipitate the polymer. The polymer was then filtered, washed with hexane and dried under vacuum at 60° C. for ~18 hours. Typical yields were between 70 and 90%. Analysis of the polymers by gel permeation chromatography and nuclear magnetic resonance spectroscopy did not reveal any detectable quantities of unreacted monomer. All monomers were purchased from Aldrich Chemical Company of Milwaukee, Wis., U.S.A, and used as received except those monomers described above.

General Absorbance Measurement Conditions:

Each calcium fluoride (CaF$_2$) substrate was cleaned by rinsing it with acetone followed by a plasma clean in a helium/oxygen barrel etcher. After this procedure, polymer absorption determinations were performed by measuring the transmission of the CaF$_2$ both prior to and after coating with the polymer sample. The polymers were dissolved to about 5% weight to weight in either cyclohexanone or propylene glycol monomethyl ether acetate. The polymers were then spin cast onto transparent (CaF$_2$) substrates and post-apply baked at a temperature of 150° C. for 30 minutes in a vacuum oven. The absorbance contributions from the solvent appeared to be negligible. The polymer thickness was determined using a profilometer after spin-casting the polymer solution on a bare silicon wafer at the same rotational velocity that was used for the CaF$_2$ substrate. Typically, resist thickness in the 70 to 150 nm range was used which usually yield transmission values at 157 nm between 10 and 60%. The absorption coefficient was determined by measuring the transmission of the polymer at three different thicknesses followed by calculating the optical density at that thickness. The absorption coefficient was then obtained by performing a linear regression least squares curve fit of the three thicknesses plus the origin as the fourth point.

All absorbance measurements were performed on polymers synthesized as above except for poly(styrene), poly(2,3,4,5,6-pentafluorostyrene), poly(4-hydroxystyrene), and poly(t-butyl acrylate), which were purchased from Aldrich and used as received.

Table 1 below provides a list of monomers, and the abbreviation for each monomer, that were utilized to synthesize an illustrative number of polymers according to the invention.

TABLE 1

| Monomer Name | Abbreviation |
| --- | --- |
| 4-fluorostyrene | 4-F-Sty |
| 3-fluorostyrene | 3-F-Sty |
| 2,3,4,5,6-pentafluorostyrene | PF-Sty |
| 4-trifluoromethylstyrene | 4-TFM-Sty |
| 3,5-bis(trifluoromethyl)styrene | 3,5-BTFM-Sty |
| 4-hexafluoroisopropyl styrene | 4-HFIPyl-Sty |
| 4-trifluoroacetyl styrene | 4-TFA-Sty |
| 4-heptafluorobutyrylstyrene | 4-HFB-Sty |
| Styrene | Sty |
| 4-t-butyl styrene | 4-TB-Sty |
| 2-hexafluoroisopropanol styrene | 2-HFIP-Sty |
| 3-hexafluoroisopropanol styrene | 3-HFIP-Sty |
| 4-hexafluoroisopropanol styrene | 4-HFIP-Sty |
| 4-t-butoxycarbonyl-hexafluoroisopropanol styrene | t-BOC-HFIP-Sty |
| 4-t-butyl acetate-hexafluoroisopropanol styrene. | t-BA-HFIP-Sty |
| t-butyl acrylate | t-BA |
| t-butyl methacrylate | t-BMA |
| t-butyl trifluoromethacrylate. | t-BTFMA |
| Hexafluoroisopropyl acrylate | HFIPA |
| Acrylonitrile | AN |
| 4-methoxymethoxy-hexafluoroisopropyl styrene | MOM-HFIP-Sty |
| Methacrylonitrile | MAN |

EXAMPLE 13

Absorbance of Fluorine Containing Homopolymers Measured at 157-nm

The following homopolymers were prepared as described in the above general polymerization conditions. For each homopolymer, the absorbance at 157 nm was measured. It can been seen by reference to Table 2 that the incorporation of fluorine into the polymers as an hexafluoroisopropanol moiety lowers the 157-nm absorbance of the polymers to a value under 4.0 $\mu m^{-1}$. It is also seen that low absorbing polymers at 157-nm all contain the trifluoromethyl moiety either as hexafluoroisopropanol or as substituted onto the aromatic ring. Absorbances of under 4.0 $\mu m^{-1}$ are considered a significant improvement in polymer absorbance when compared to the absorbance of poly(vinylphenol) of nearly 7 $\mu m^{-1}$. For example, a polymer having an absorbance at 157-nm which is under 4.0 $\mu m^{-1}$ can be used to formulate a photoresist with a film thickness of over 100 nm.

TABLE 2

| Polymer Name | $\alpha_{157}$ ($\mu m^{-1}$) |
| --- | --- |
| poly(4-fluorostyrene) | 7.00 |
| poly(3-fluorostyrene) | 7.08 |
| poly(pentafluorostyrene) | 5.80 |
| poly(4-trifluoromethyl styrene) | 4.33 |
| poly(3,5-bis(trifluoromethyl) styrene) | 3.63 |
| poly(styrene) | 6.60 |
| poly(4-t-butyl styrene) | 5.67 |

TABLE 2-continued

| Polymer Name | $\alpha_{157}$ ($\mu m^{-1}$) |
| --- | --- |
| poly(2-hexafluoroisopropanol styrene) | 3.40 |
| poly(3-hexafluoroisopropanol styrene) | 3.80 |
| poly(4-hexafluoroisopropanol styrene) | 3.44 |
| poly(4-t-BOC-hexafluoroisopropanol styrene) | 2.95 |
| poly(4-t-butylacetate-hexafluoroisopropanol styrene) | 4.29 |
| poly(t-butyl acrylate) | 5.43 |
| poly(vinyl phenol) | 6.70 |
| poly(4-MOM-hexafluoroisopropanol) | 2.60 |

EXAMPLE 14

Absorbance of Fluorine Containing Copolymers Measured at 157-nm

The following copolymers were prepared as described in the above general polymerization conditions. For each copolymer, the absorbance at 157 nm was measured. It can be seen with reference to Table 3 that the incorporation of fluorine into the polymers as a hexafluoroisopropanol moiety lowers the 157-nm absorbance of the polymers to under 4.0 $\mu m^{-1}$ in all but two examples. Absorbance values under 4.0 $\mu m^{-1}$ are considered a significant improvement in polymer absorbance when compared to the absorbance of poly(vinylphenol) of nearly 7 $\mu m^{-1}$. Polymers with an absorbance under 4.0 $\mu m^{-1}$ can be used to formulate 157-nm sensitive resists with film thickness of over 100 nm.

TABLE 3

| Polymer | Monomer 1 | Monomer 2 | Ratio | $\alpha_{157}$ ($\mu m^{-1}$) |
| --- | --- | --- | --- | --- |
| 18 | 4-HFIP-Sty | HFIPA | 60/40 | 3.42 |
| 19 | 4-HFIP-Sty | 3-HFIP-Sty | 50/50 | 3.45 |
| 20 | 4-HFIP-Sty | t-BMA | 60/40 | 3.99 |
| 21 | 4-HFIP-Sty | t-BMA | 50/50 | 4.05 |
| 22 | 4-HFIP-Sty | t-BA | 70/30 | 3.74 |
| 23 | 3-HFIP-Sty | t-BA | 60/40 | 3.92 |
| 24 | 3-HFIP-Sty | t-BMA | 60/40 | 4.10 |
| 25 | 4-HFIP-Sty | t-BTFMA | 75/25 | 3.71 |
| 26 | 4-KFIP-Sty | t-BOC-HFIP-Sty | 70/30 | 3.58 |
| 27 | 4-HFIP-Sty | t-BOC-HFIP-Sty | 60/40 | 3.44 |
| 28 | 4-HFIP-Sty | t-BA-HFIP-Sty | 60/40 | 3.80 |

EXAMPLE 15

Absorbance of Fluorine Containing Terpolymers Measured at 157-nm

The following terpolymers were prepared as described in the above general polymerization conditions. For each terpolymer, the absorbance at 157 nm was measured . As it can be seen in Table 4, the incorporation of fluorine into the polymers as an hexafluoroisopropanol moiety lowers the 157-nm absorbance of the polymers to a value under 4.0 $\mu m^{-1}$ in all but one example. Absorbance values under 4.0 $\mu m^{-1}$ are considered a significant improvement in polymer absorbance when compared to the absorbance of poly(vinylphenol) of nearly 7 $\mu m^{-1}$. Polymers with an absorbance under 4.0 $\mu m^{-1}$ can be used to formulate 157-nm sensitive resists with film thickness of over 100 nm.

TABLE 4

| Polymer | Monomer 1 | Monomer 2 | Monomer 3 | Ratio | $\alpha_{157}$ ($\mu m^{-1}$) |
|---|---|---|---|---|---|
| 29 | 4-HFIP-Sty | t-BMA | 3,5-BTFM-Sty | 60/20/20 | 3.59 |
| 30 | 4-HFIP-Sty | t-BMA | 4-HFIPly-Sty | 60/20/20 | 3.89 |
| 31 | 4-HFIP-Sty | t-BMA | 4-HFB-Sty | 60/20/20 | 4.03 |
| 32 | 4-HFIP-Sty | t-BMA | 3,5-BTFM-Sty | 70/20/10 | 3.78 |
| 33 | 4-HFIP-Sty | t-BMA | AN | 70/20/10 | 3.80 |
| 34 | 4-HFIP-Sty | t-BMA | MAN | 70/20/10 | 3.72 |

General Lithography Process Conditions:

The post apply bake (PAB) was performed by placing the silicon wafer on a hot plate at the desired time and temperature. Shipley LLD-26W, marketed by Shipley Company of Marlboro Mass., U.S.A, a commercial resist developer was utilized for development. The clearing dose ($E_0$) is defined as the lowest exposure dose required to remove all resist after development. The clearing dose was determined by either fitting a line through all points containing less then 80% normalized film thickness as a function of dose and determining the intercept for zero remaining film thickness, or if no slope could be determined, by noting the lowest exposure dose for which no resist remained.

The contrast ($\gamma$) was determined by fitting a line through all points containing less then 80% normalized film thickness as a function of the log of dose and determining the absolute value of the slope. The unexposed film thickness loss (UFTL) was determined by subtracting the film thickness of an unexposed portion of the resist after development from the film thickness of the resist prior to exposure. The resolution was determined by exposing the resist through a chrome on quartz mask containing equal pitch dense features of 250, 200, 180, and 150 nm and determining the smallest feature that printed.

In the following examples di-t-butylphenyl iodonium camphor sulfonate (TBPI-CS) and di-t-butylphenyl iodonium perfluorobutyl sulfonate (TBPI-PFBS) are used as photoacid generators (PAG) and tetrabutyl ammonium hydroxide (TBAH) is used as a base additive.

EXAMPLE 16

Preparation of HFIP-based Positive Acid Catalyzed Resists Imaged at 100 nm Thickness The resist was prepared by adding the polymer, PAG, and base in the amounts listed below in Table 5 to 1567 parts of ethyl lactate solvent to make an approximately 6.0% weight of solids to total weight solution. The solution was rolled over night and filtered through a 0.2 $\mu$m filter.

To determine $E_0$ and UFTL, the resist was spin cast to an approximately a 100 nm film on a HMDS vapor primed silicon wafer followed by a PAB at 130° C. for 60 seconds. The resist was exposed to 157 nm light at a series of different doses between 0 and 200 mJ/cm². After exposure, the wafer was PEB baked at a temperature of 130° C. for 90 seconds. The wafer was then immersed in a surfactant containing 2.38% aqueous tetramethyl ammonium hydroxide solution for 15 seconds, removed and rinsed with DI water, and dried under a stream of nitrogen gas. The $E_0$ and UFTL were then determined and are reported below in Table 6.

To determine resolution, the resist was spin cast to an approximately 100 nm film on a HMDS vapor primed silicon wafer followed by a PAB at a temperature of 130° C. for 60 seconds. The resist was exposed to 157 nm light through a chrome on quartz mask at a series of different doses and focuses. After exposure, the wafer was PEB baked at a temperature of 130° C. for 90 seconds. The wafer was then immersed in a surfactant containing 2.38% aqueous tetramethyl ammonium hydroxide solution for 15 seconds, removed and rinsed with DI water, and dried under a stream of nitrogen gas. The resolution was determined and reported below.

TABLE 5

| Resist | Amount | Polymer | Amount | PAG | Amount | Base |
|---|---|---|---|---|---|---|
| 20004 | 96 | 28 | 4 | TBPI-PFBS | 1.2 | TBAH |
| 20005 | 94 | 28 | 6 | TBPI-PFBS | 1.2 | TBAH |
| 20006 | 92 | 28 | 8 | TBPI-PFBS | 1.2 | TBAH |

TABLE 6

| Resist | $E_0$ (mJ/cm²) | UFTL (nm) | Contrast ($\gamma$) | Resolution (nm) |
|---|---|---|---|---|
| 20005 | 1.1 | 0.1 | 4.9 | 200 |
| 20006 | 1.0 | −0.5 | 5.1 | 250 |

The resolution shows that only the resists generating perfluorosulfonic acid are able to print features having sizes of 250 nm and less. The level of sensitivity of resists that imaged is sufficient to allow for high levels of manufacturing throughput. Further, the results show that the UFTL is low in all cases and that the contrast is high for all resists in which contrast was measured. In addition, the above results show that resists based on HFIP-containing aromatic polymers can be utilized as high-resolution positive acid catalyzed resists at a 100-nm thickness in 157-nm based lithography.

EXAMPLE 17

Preparation of HFIP-based Positive Acid Catalyzed Resists Imaged at 150 nm Thickness The resist was prepared by adding the polymer, PAG, and base in the amounts listed below in Table 7 to 1567 parts of ethyl lactate solvent to make an approximately 6.0% weight of solids to total weight solution. The solution was rolled over night and filtered through a 0.2 $\mu$m filter.

To determine $E_0$ and UFTL, the resist was spin cast to an approximately a 150 nm film on a HMDS vapor primed silicon wafer followed by a PAB at 130° C. for 60 seconds. The resist was exposed to 157 nm light at a series of different doses between 0 and 200 mJ/cm². After exposure, the wafer was PEB baked at 130° C. for 90 seconds. The wafer was then immersed in a surfactant containing 2.38% aqueous tetramethyl ammonium hydroxide solution for 30 seconds, removed and rinsed with DI water, and dried under a stream of nitrogen gas. The $E_0$ and UFTL were then determined and are reported below in Table 8.

To determine resolution, the resist was spin cast to an approximately 150 nm film on a HMDS vapor primed silicon wafer followed by a PAB at a temperature of 130° C. for 60 seconds. The resist was exposed to 157 nm light through a chrome on quartz mask at a series of different doses and focuses. After exposure, the wafer was PEB baked at a temperature of 130° C. for 90 seconds. The wafer was then immersed in a surfactant containing 2.38% aqueous tetramethyl ammonium hydroxide solution for 30 seconds, removed and rinsed with DI water, and dried under a stream of nitrogen gas. The resolution was determined and reported below in Table 8.

TABLE 7

| Resist | Amount | Polymer | Amount | PAG | Amount | Base |
|---|---|---|---|---|---|---|
| 20005 | 94 | 28 | 6 | TBPI-PFBS | 1.2 | TBAH |
| 20006 | 92 | 28 | 8 | TBPI-PFBS | 1.2 | TBAH |

TABLE 8

| Resist | $E_0$ (mJ/cm$^2$) | UFTL (nm) | Contrast ($\gamma$) | Resolution (nm) |
|---|---|---|---|---|
| 20005 | 0.9 | 0.5 | 4.9 | 250 |
| 20006 | 1.4 | Na | 6.2 | 250 |

The above resolution data shows that the resists generating perfluorosulfonic acid are able to print features having sizes of 250 nm. The level of sensitivity of resists that imaged is sufficient to allow for high levels of manufacturing throughput. The results also show that the UFTL is low in all cases, and that the contrast is high for all resists in which contrast was measured. The results further show that resists based on HFIP containing aromatic polymers can be used as high-resolution positive acid catalyzed resists at a 150-nm thickness in 157-nm based lithography.

EXAMPLE 18

Preparation of HFIP-based Positive Acid Catalyzed Resists Imaged at 100 nm Thickness The resist was prepared by adding the polymer, PAG, and base in the amounts listed below in Table 9 to 1900 parts of ethyl lactate solvent to make an approximately 5.0% weight of solids to total weight solution. The solution was rolled over night and filtered through a 0.2 μm filter.

To determine $E_0$ and UFTL, the resist was spin cast to an approximately a 100 nm film on a HMDS vapor primed silicon wafer followed by a PAB at a temperature of 130° C. for 60 seconds. The resist was exposed to 157 nm light at a series of different doses between 0 and 200 mJ/cm$^2$. After exposure, the wafer was PEB baked at 130° C. for 90 seconds. The wafer was then immersed in a surfactant containing 2.38% aqueous tetramethyl ammonium hydroxide solution for 15 seconds, removed and rinsed with DI water, and dried under a stream of nitrogen gas. The $E_0$ and UFTL were then determined and are reported below in Table 10.

To determine resolution, the resist was spin cast to an approximately 100 nm film on a HMDS vapor primed silicon wafer followed by a PAB at a temperature of about 130° C. for 60 seconds. The resist was exposed to 157 nm light through a chrome on quartz mask at a series of different doses and focuses. After exposure, the wafer was PEB baked at 130° C. for 90 seconds. The wafer was then immersed in a surfactant containing 2.38% aqueous tetramethyl ammonium hydroxide solution for 15 seconds, removed and rinsed with DI water, and dried under a stream of nitrogen gas. The resolution was determined and reported below in Table 10.

TABLE 9

| Resist | Amount | Polymer | Amount | PAG | Amount | Base |
|---|---|---|---|---|---|---|
| 20007 | 94 | 21 | 6 | TBPI-CS | 1.2 | TBAH |
| 20008 | 94 | 23 | 6 | TBPI-CS | 1.2 | TBAH |

TABLE 10

| Resist | $E_0$ (mJ/cm$^2$) | UFTL (nm) | Contrast ($\gamma$) | Resolution (nm) |
|---|---|---|---|---|
| 20007 | 1.0 | 19.9 | 10.4 | 200 |
| 20008 | 1.0 | −0.2 | 17.4 | 200 |

The resolution data shows that only the resists generating perfluorosulfonic acid are able to print features having sizes of 200 nm. The level of sensitivity of resists that imaged is sufficient to allow for high levels of manufacturing throughput. The results also show that the UFTL is low in all cases, and that the contrast is high for all resists in which contrast was measured. The results further show that resists based on HFIP containing aromatic polymers can be used as high-resolution positive acid catalyzed resists at a 100 nm thickness in 157-nm based lithography.

EXAMPLE 19

Preparation of HFIP-based Positive Acid Catalyzed Resists Imaged at 100 nm Thickness The resist was prepared by adding the polymer, PAG, and base in the amounts listed below in Table 11 to 1567 parts of ethyl lactate solvent to make an approximately 6.0% weight of solids to total weight solution. The solution was rolled over night and filtered through a 0.2 μm filter.

To determine $E_0$ and UFTL, the resist was spin cast to an approximately 100 nm film on a HMDS vapor primed silicon wafer followed by a PAB at 130° C. for 60 seconds. The resist was exposed to 157 run light at a series of different doses ranging between 0 and 200 mJ/cm$^2$. After exposure, the wafer was PEB baked at 130° C. for 90 seconds. The wafer was then immersed in a surfactant containing 2.38% aqueous tetramethyl ammonium hydroxide solution for 15 seconds, removed and rinsed with DI water, and dried under a stream of nitrogen gas. The $E_0$ and UFTL were then determined and are reported below in Table 12.

To determine resolution, the resist was spin cast to an approximately 100 nm film on a HMDS vapor primed silicon wafer followed by a PAB at 130° C. for 60 seconds. The resist was exposed to 157 nm light through a chrome on quartz mask at a series of different doses and focuses. After exposure, the wafer was PEB baked at 130° C. for 90 seconds. The wafer was then immersed in a surfactant containing 2.38% aqueous tetramethyl ammonium hydroxide solution for 15 seconds, removed and rinsed with DI water, and dried under a stream of nitrogen gas. The resolution was determined and reported below in Table 12.

TABLE 11

| Resist | Amount | Polymer | Amount | PAG | Amount | Base |
|---|---|---|---|---|---|---|
| 20012 | 96 | 29 | 4 | TBPI-PFBS | 1.2 | TBAH |
| 20013 | 94 | 29 | 6 | TBPI-PFBS | 1.2 | TBAH |
| 20014 | 92 | 29 | 8 | TBPI-PFBS | 1.2 | TBAH |

TABLE 12

| Resist | $E_0$ (mJ/cm$^2$) | UFTL (nm) | Contrast ($\gamma$) | Resolution (nm) |
|---|---|---|---|---|
| 20012 | 2.0 | 0.2 | 9.1 | 150 |
| 20013 | 2.9 | 0.5 | 4.1 | 200 |
| 20014 | 1.7 | 0.4 | 5.4 | 180 |

The above resolution data shows that only the resists generating perfluorosulfonic acid are able to print features having sizes of 250 nm and less. The level of sensitivity of the resists that imaged is sufficient to allow for high levels of manufacturing throughput. The results also show that the UFTL is low in all cases, and that the contrast is high for all resists in which contrast was measured. The results further show that resists based on HFIP-containing aromatic polymers can be used as high-resolution positive acid catalyzed resists at a 100-nm thickness in 157-mn based lithography.

EXAMPLE 20

Preparation of HFIP-based Positive Acid Catalyzed Resists Imaged at 100 nm Thickness The resist was prepared by adding the polymer, PAG, and base in the amounts listed below in Table 13 to 1567 parts of ethyl lactate solvent to make an approximately 6.0% weight of solids to total weight solution. The solution was rolled over night and filtered through a 0.2 μm filter.

To determine $E_0$ and UFTL, the resist was spin cast to an approximately a 100 nm film on a HMDS vapor primed silicon wafer followed by a PAB at 130 C. for 60 seconds. The resist was exposed to 157 nm light at a series of different doses between 0 and 200 mJ/cm². after exposure, the wafer was PEB baked at 130 C. for 90 seconds. The wafer was then immersed in a surfactant containing 2.38% aqueous tetramethyl ammonium hydroxide solution for 30 seconds, removed and rinsed with DI water, and dried under a stream of nitrogen gas. The $E_0$ and UFTL were then determined and are reported below in Table 14.

To determine resolution, the resist was spin cast to an approximately 100 nm film on a HMDS vapor primed silicon wafer followed by a PAB at 130 C. for 60 seconds. The resist was exposed to 157 nm light through a chrome on quartz mask at a series of different doses and focuses. After exposure, the wafer was PEB baked at 130 C. for 90 seconds. The wafer was then immersed in a surfactant containing 2.38% aqueous tetramethyl ammonium hydroxide solution for 30 seconds, removed and rinsed with DI water, and dried under a stream of nitrogen gas. The resolution was determined and reported below in Table 14.

TABLE 13

| Resist | Amount | Polymer | Amount | PAG | Amount | Base |
|---|---|---|---|---|---|---|
| 20018 | 94 | 21 | 6 | TBPI-CS | 1.2 | TBAH |
| 20019 | 92 | 21 | 8 | TBPI-CS | 1.2 | TBAH |
| 20021 | 94 | 21 | 6 | TBPI-PFBS | 1.2 | TBAH |

TABLE 14

| Resist | $E_0$ (mJ/cm²) | UFTL (nm) | Contrast (γ) | Resolution (nm) |
|---|---|---|---|---|
| 20018 | 4.0 | 26.0 | 3.3 | 250 |
| 20019 | 3.0 | 17.5 | 3.9 | 250 |
| 20021 | 1.2 | 28.7 | 5.5 | 250 |

The resolution data shows that only the resists generating perfluorsulfonic acid are able to print features having sizes of 250 nm. A large value of UFTL indicates that the polymer has insufficient inhibition, and that the t-butyl ester ratio in the resist should be increased. The level of sensitivity of resists that imaged is sufficient to allow for high levels of manufacturing throughput.

What is claimed is:

1. A photoresist for use in lithography at a wavelength less than about 248 nm, comprising a co-polymer having chemical formula:

[—A—B—]$n$ wherein A is selected from the group consisting of 2-hexafluoroisopropanol styrene, 3-hexafluoroisopropanol styrene, and 4-hexafluoroisopropanol styrene, and B is selected to be a styrene group having a fluorinated alkyl side chain.

2. The photo-resist of claim 1, wherein said photo-resist composition is configured to have an absorbance at 157 nm in a range of about 1 to about 5 $\mu m^{-1}$.

3. The photo-resist of claim 1, wherein said photoresist composition is configured to have an absorbance at 157 nm in a range of approximately 2 $\mu m^{-1}$ to approximately 4 $\mu m^{-1}$.

4. A photoresist for use in lithography at a wavelength less than about 248 nm, comprising a copolymer having a chemical formula.

[-A-A'-]$n$ wherein A and A' are two different hexafluoroisopropanol styrene moieties selected from the group consisting of 2-hexafluoroisopropanol styrene, 3-hexafluoroisopropanol styrene, and 4-hexafluoroisopropanol styrene.

5. A photoresist for use in lithography at a wavelength less than about 248 nm, comprising a copolymer having a chemical formula:

[-A-B-]$n$ wherein A is selected from the group consisting of 2-hexafluoroisopropanol styrene, 3-hexafluoroisopropanol styrene, and 4-hexafluoroisopropanol styrene, and B is selected from to group consisting of 2,3, or 4-butyl acetate-hexafluoroisopropanol styrene, 2,3, or 4-methoxymethyl-hexafluoroisopropanol styrene, t-butyl acrylate, t-butyl methacrylate, and t-butyl trifluoromethacrylate.

6. The photoresist of claim 5, wherein A has a molar concentration in a range of at least 40 and less than 100%, and has a molar concentration in a range greater than 0 and less than or equal to 60%.

7. The photoresist of claim 5, wherein A has a molar concentration in a rang of 50 to 80% and B has a molar concentration in a range of about 20 to 50%.

8. The photoresist of claim 5, wherein said polymer has a molecular weight in a range of about 5000 to 100,000 Daltons.

9. A photoresist for use in lithography at a wavelength less than about 248 nm, comprising a copolymer having a chemical formula:

[-A-C-]$n$ wherein A is selected from the group consisting of 2-hexafluoroisopropanol styrene, 3-hexafluoroisopropanol styrene, and 4-hexafluoroisopropanol styrene, and C is selected from the group consisting of 4-t-butylstyrene, 2,3, or 4-fluorostyrene, 2,3,4,5,6-pentafluorostyrene, 2,3, or 4-trifluoromethylstyrene, 3,5-bis(trifluoromethyl)styrene, 2,3, or 4-hexafluoroisopropylstyrene, 2,3, or 4-trifluoroacetylstyrene, 2,3, or 4-hexafluoroisopropylstyrene, and methacrylonitrile.

10. The photoresist of claim 9, wherein A has a molar concentration in a range of at least 40 and less than 100% , and B has a molar concentration in a range greater than 0 and less or equal to 60%.

11. The photoresist of claim 9, wherein A has a molar concentration in a range of 50 to 80% and C has a molar concentration in a range of about 20 to 50%.

12. The photoresist of claim 9, wherein said polymer has a molecular weight in a range of about 5000 to 100,000 Daltons.

13. A photoresist for use in lithography at a wavelength less than about 248 nm, comprising a terpolymer having a chemical formula:

[-A-A'-A"-]$n$ wherein A is selected to be 2-hexafluoroisopropanol styrene, and A' is selected to be 3-hexafluoroisopropanol styrene, and A" is selected to be 4-hexafluoroisopropanol styrene.

14. The photoresist of claim 13, wherein said polymer has a molecular weight in a range of about 5000 to 100,000 Daltons.

15. A photoresist for use in lithography at a wavelength less than about 248 nm, comprising a terpolymer having a chemical formula:

[-A-B-C-]$n$ wherein A is selected from the group consisting of 2-hexafluoroisopropanol styrene, 3-hexafluoroisopropanol styrene, and 4-hexafluoroisopropanol styrene, and B is selected from the group consisting of 2,3, or 4-t-butoxycarbonyl-hexafluoroisopropanol styrene, 2,3, or 4-t-butyl acetate-hexafluoroisopropanol styrene, 2,3, or 4-methoxymethyl-hexafluoroisopropanol styrene, t-butyl acrylate, t-butyl methacrylate, and t-butyl trifluoromethacrylate, and C is selected from the group consisting of styrene, 4-t-butylstyrene, 2,3, or 4-fluorostyrene, 2,3,4,5,6-pentafluorostyrene, 2,3, or 4-trifluoromethylstyrene, 3,5-bis(trifluoromethyl)styrene, 2,3, or 4-hexafluoroisopropanol, 2,3, or 4-trifluoroacetylstyrene, 2,3, or 4-heptafluorobutyrylstyrene, acrylonitrile, or methacrylonitrile.

16. The photoresist of claim 15, wherein A has a molar concentration in a range of at least 40 and less than 100%, and B has a molar concentration in a range greater than 0 and less than or equal to 60%, and C has a molar concentration in a range greater than 0 and less than or equal to 50%.

17. The photoresist of claim 15, wherein A has a molar concentration in a range of about 50–80%, and B has a molar concentration in a range of about 20–50%, and C has a molar concentration in a range greater than 0 and less than or equal to 30%.

18. The photoresist of claim 15, wherein said polymer has a molecular weight in a range of about 5000 to 100,000 Daltons.

19. A photoresist for use in lithography at a wavelength less than about 248 mm, comprising
   a polymer having at least one monomeric unit with an aromatic moiety, said monomeric unit further comprising at least one halogenated group attached to said aromatic moiety, wherein said group includes at least one CF bond and an acidic hydroxyl group
   a photoacid generator, and
   a base additive.

20. The photoresist of claim 19, wherein said photoacid generator is an onium salt.

21. The photoresist of claim 19, wherein said photoacid generator is selected from the group consisting triphenylsulfonium salts, sulfonium salts, iodonium salts, diazonium salts, ammonium salts, 2,6-nitrobenzylesters, aromatic sulfonates, sulfosuccinimides, diphenyliodonium triflate, diphenyliodonium tosylate, bis(4-tert-butylphenyl) iodonium triflate, bis(4-tert-butylphenyl)iodonium camphorsulfate, bis(4-tert-butylphenyl)iodonium perfluorobutylate, bis(4-tert-butylphenyl)iodonium tosylate, triphenylsulfonium hexafluorophosphate, triphenylsulfonium triflate, and triphenylsulfonium perfluorobutylate.

22. The photoresist of claim 19, wherein said base additive has a concentration less than about 1 weight percent.

23. The photoresist of claim 19, wherein said base additive is selected from the group consisting of tetrabutylammonium hydroxide, diazabicyclo[5.4.0]undec-7-ene, diphenyl amine, trioctyl amine, and triheptyl amine.

24. A single layer 157 nm sensitive photoresist, comprising:
   a photoresist composition comprising a co-polymer having a chemical formula:

[-A-B-]$n$ wherein A is selected to be hexafluoroisopropanol styrene, and B is selected from the group consisting of ester derivative of hexafluoroisopropanol styrene, fluoro-substituted ester derivative of hexafluoroisopropanol styrene, acetal derivative of hexafluoroisopropanol styrene, fluorosubstituted acetal derivative of hexafluoroisopropanol styrene, ketal derivative of hexafluoroisopropanol, fluorosubstituted ketal derivative of hexafluoroisopropanol styrene, an acrylate derivative, a methacrylate derivative, a fluorosubstituted acrylate derivative, and fluorosubstituted methacrylate derivative.

25. The photoresist of claim 24, wherein said A constituent is selected from the group consisting of 2-hexafluoroisopropanol styrene, 3-hexafluoroisopropanol styrene, and 4-hexafluoroisopropanol styrene.

26. A single layer 157 nm sensitive photoresist, comprising
   a photoresist composition comprising a polymer having a first monomeric unit selected from the group consisting of 2-hexafluoroisopropanol styrene, 3-hexafluoroisopropanol styrene, and 4-hexafluoroisopropanol styrene, and
   a second monomeric unit selected from the group consisting of 2,3, or 4-t-butyl acetate-hexafluoroisopropanol styrene, 2,3, or 4-methoxymethyl-hexafluoroisopropanol styrene, t-butyl acrylate, t-butyl methacrylate, and t-butyl trifluoromethacrylate.

27. A single layer 157 nm sensitive photoresist, comprising
   a photoresist composition comprising a polymer having a first monomeric unit selected front the group consisting of 2-hexafluoroisopropanol styrene, 3-hexafluoroisopropanol styrene, and 4-hexafluoroisopropanol styrene,
   a second monomeric unit selected from the group consisting of 2,3, or 4-t-butyl acetate-hexafluoroisopropanol styrene, 2,3, or 4-methoxymethyl-hexafluoroisopropanol styrene, t-butyl acrylate t-butyl methacrylate, and t-butyl trifluoromethacrylate, and
   a third monomeric unit selected from the group consisting of styrene, 4-t-butylstyrene, 2,3, 4-fluorostyrene, 2,3, 4,5,6-pentafluorostyrene, 2,3, or 4-trifluoromethylstyrene, 3,5-bis(trifluoromethyl) styrene, 2,3,4-hexafluoroisopropylstyrene, 2,3, or 4-trifluoroacetylstyrene, 2,3, or 4-heptafluorobutyrylstyrene, acrylonitrile, and methacrylonitrile.

28. A photo-resist for use in lithography at a wavelength less than about 248 nm, comprising a polymer having at least one monomeric unit with an aromatic moiety, said monomeric unit further comprising at least one halogenated group attached to said aromatic moiety, wherein said group includes at least one CF bond and an acidic hydroxyl group, wherein said photoresist is configured to form a film having a thickness in a range of approximately 50 nm to approximately 300 nm.

29. A photo-resist for use in lithography at a wavelength less than about 248 nm, comprising a polymer having at least one monomeric unit with an aromatic moiety, said monomeric unit further comprising at least one halogenated group attached to said aromatic moiety, wherein said group includes at least one CF bond and an acidic hydroxyl group, wherein said photoresist is configured to form a film having a thickness in a range of approximately 100 nm to approximately 150 nm.

30. A photoresist composition, comprising a styrene moiety and a hexafluoroisopropyl moiety attached to carbon atom of an aromatic ring of said styrene moiety.

31. A photoresist composition, comprising a styrene moiety and a 4-heptafluorobutyryl moiety attached to a carbon atom of an aromatic ring of said styrene moiety.

32. A photoresist composition, comprising a styrene moiety and a t-butyl acetate-hexafluoroisopropanol moiety attached to a carbon atom of an aromatic ring of said styrene moiety.

33. A photoresist composition, composition a styrene moiety and a methoxymethylhexafluoroisopropyl moiety attached to a carbon atom of an aromatic ring of said styrene moiety.

34. A photoresist for use in lithography at a wavelength less than about 248 nm, comprising a co-polymer having a chemical formula:

$$[-A-B-]_n$$

wherein A is selected from the group consisting of 2-hexafluoroisopropanol styrene, 3-hexafluoroisopropanol styrene, and 4-hexafluoroisopropanol styrene, and B is selected to be any of acetal, ketal, or ester derivative of hexafluoroisopropanol styrene.

35. A photoresist for use in lithography at a wavelength less than about 248 nm, comprising a co-polymer having a chemical formula:

$$[-A-B-]_n$$

wherein A is selected from the group consisting of 2-hexafluoroisopropanol styrene, 3-hexafluoroisopropanol styrene, and 4-hexafluoroisopropanol styrene, and B is selected to be any of acrylate or methacrylate derivative.

36. A photoresist for use in lithography at a wavelength less than about 248 nm, comprising a co-polymer having a chemical formula:

$$[-A-B-]_n$$

wherein A is selected from the group consisting of 2-hexafluoroisopropanol styrene, 3-hexafluoroisopropanol styrene, and 4-hexafluoroisopropanol styrene, and B is selected to be any of fluorosubstituted acrylate derivative or fluorosubstituted methacrylate derivative.

* * * * *